United States Patent [19]

Adachi et al.

[11] Patent Number: 4,731,172
[45] Date of Patent: Mar. 15, 1988

[54] METHOD FOR SPUTTERING MULTI-COMPONENT THIN-FILM

[75] Inventors: Hideaki Adachi; Hidetaka Higashino; Tsuneo Mitsuyu; Osamu Yamazaki, all of Osaka, Japan

[73] Assignee: Matsushita Electric Industrial Co., Ltd., Japan

[21] Appl. No.: 856,783

[22] Filed: Apr. 17, 1986

[30] Foreign Application Priority Data

Apr. 18, 1985 [JP] Japan ............................ 60-82872
Jul. 9, 1985 [JP] Japan ............................ 60-150746
Oct. 9, 1985 [JP] Japan ............................ 60-225110
Jan. 10, 1986 [JP] Japan ............................ 61-3780

[51] Int. Cl.$^4$ ............................................ C23C 14/34
[52] U.S. Cl. ........................... 204/192.26; 204/192.15
[58] Field of Search ..................... 204/192.12, 192.14, 204/192.15, 192.18, 192.2, 192.22, 192.26, 192.27, 192.28, 192.29; 427/37, 38, 39

[56] References Cited

U.S. PATENT DOCUMENTS

3,997,690 12/1976 Chen ........................ 204/192.26 X
4,444,635 4/1984 Kobayhashi et al. ...... 204/192.15 X
4,461,807 7/1984 Mori et al. ........................ 428/469

Primary Examiner—John F. Niebling
Assistant Examiner—Nam X. Nguyen
Attorney, Agent, or Firm—Lowe, Price, LeBlanc, Becker & Shur

[57] ABSTRACT

A underlying layer of multi-component material of a first formula is deposited on a substrate by controlling the amounts of sputtering materials evaporated respectively from a plurality of sputtering sources. A transition layer of multi-component material is subsequently formed on the underlying layer by controlling the amounts of the sputtering materials so that the transition layer is given a second, variable formula varying in a range from the first formula at the boundary between the underlying layer and the transition layer to a third formula: An overlying layer of multi-component material of the third formula is subsequently formed on the transition layer by controlling the amounts of the sputtering materials. Specifically, the first formula is $[Pb_{1-(x/100)}La_{x/100}][Zr_{y/100}Ti_{z/100}]_w O_3$, in which $10 \leq x \leq 40$, $y \leq 5$, $w = 1-(x/400)$ and $y+z=100$, and the third formula is $[Pb_{1-(X/100)}La_{X/100}][Zr_{Y/100}Ti_{Z/100}]_W O_3$, in which $X \leq 20$, $40 \leq Y \leq 90$, $W = 1-(X/400)$ and $Y+Z=100$.

9 Claims, 7 Drawing Figures

METHOD FOR SPUTTERING MULTI-COMPONENT THIN-FILM

BACKGROUND OF THE INVENTION

The present invention relates to a multi-component thin film device and a method for fabricating the device.

A primary concern to the designer of multi-component thin film devices is the difficulty that is encountered during manufacture to control the formula of the thin-film composition, particularly if the multi-component structure contains elements whose vapor pressures vary significantly from one element to another. Revaporization of high vapor-pressure components from the surface of a crystallized or epitaxially grown film has been observed in cases where the substrate is heated. A multi-component film of a desired formula may be obtained. However, the crystal structure is not necessarily a desired one as it is adversely affected by the formula.

SUMMARY OF THE INVENTION

It is therefore an object of the present invention to provide a method for forming a multi-component thin film device which eliminates the aforesaid difficulty and a multi-component thin film device manufactured according to this method.

The present invention provides a method for forming a multi-component thin film, which comprises forming a first layer of a multi-component material of a first formula on a substrate. A second, transition layer of a multi-component material of a second, variable formula is deposited on the first layer. A third layer of a multi-component material of a third formula is subsequently deposited on the transition layer. The second formula is variable in a range from the first formula at the boundary between the first and second layers to the third formula at the boundary between the second and third layers.

A multi-component thin-film device of the present invention is manufactured by the above method, which device comprises a substrate, a first layer formed on the substrate and consisting essentially of a multi-component material of a first formula $[Pb_{1-(x/100)}La_{x/100}][Zr_{y/100}Ti_{z/100}]_wO_3$, where $10 \leq X \leq 40$, $y \leq 5$, $w = 1 - (x/400)$ and $y + z = 100$, a third layer consisting essentially of a multi-component material of a third formula $[Pb_{1-(X/100)}La_{X/100}][Zr_{Y/100}Ti_{Z/100}]_wO_3$, in which $X \leq 20$, $40 \leq Y \leq 90$, $W = 1 - (X/400)$ and $Y + Z = 100$, and a second transition layer formed between the first and third layers, the second transition layer having a composition varying in a range from the first formula at the boundary between the first and second layers to the third formula at the boundary between the second and third layers.

BRIEF DESCRIPTION OF THE DRAWINGS

The present invention will be described in further detail with reference to the accompanying drawings, in which.

DETAILED DESCRIPTION

Figure 1:
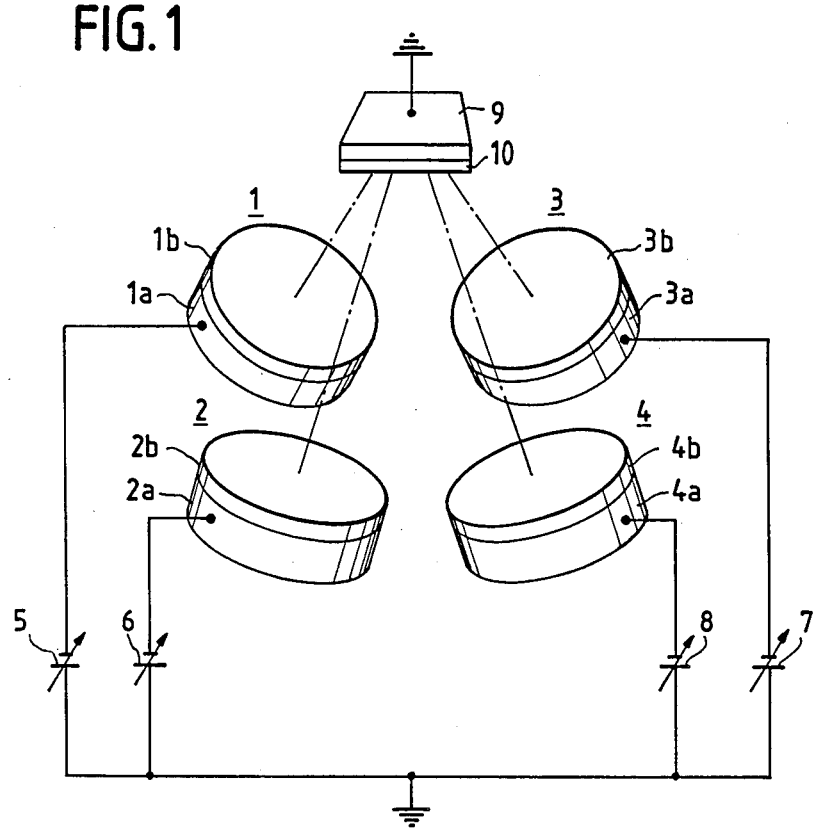
FIG. 1 is a perspective view of a sputtering apparatus according to an embodiment of the present invention.
Figure 2:
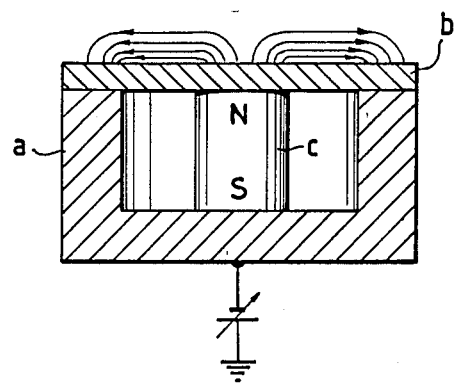
FIG. 2 is a cross-sectional view of a sputtering source of FIG. 1.

Referring now to FIG. 1, a sputtering apparatus of the invention comprises a set of sputtering sources 1, 2, 3 and 4 placed inside of a vacuum chamber. Each of the sputtering sources 1-4 includes a cylindrical ferromagnetic core a, a disc b of a sputtering material and a permanent magnet c as shown in FIG. 2. Sputtering discs 1b, 2b, 3b and 4b are formed of lead (Pb), lanthanum (La), zirconium (Zr) and titanium (Ti), respectively. Permanent magnets c produce a magnetic field with a strength of 1000 Gauss, the field being parallel to the plane of each sputtering disc b to cause plasma to be effectively concentrated on the surfaces of the sputtering materials. Hollow cylindrical cores 1a, 2a, 3a and 4a are respectively connected to high DC voltage sources 5, 6, 7 and 8 so that sputtering materials form cathode sections of the apparatus. A substrate 10 is attached to the underside of an anode 9 which is located a distance of 100 mm from each of the sputtering sources. Substrate 10 is formed of sapphire having a $\alpha\text{-Al}_2O_3(0001)$ plane facing downwards to permit epitaxial growth of a PLZT thin film having a crystal plane (111). Sputtering sources 1-4, each with a diameter of 60 mm and a thickness of 2 mm, are located with a center-to-center spacing of 100 mm and oriented so that the normal to the plane of each source surface forms an angle of 30 degrees with the normal to the plane of substrate 10. Voltage sources 5-8 are respectively adjustable to control the input power levels of the sputtering sources and hence the amounts of source materials to be deposited on substrate 10.

Figure 3:
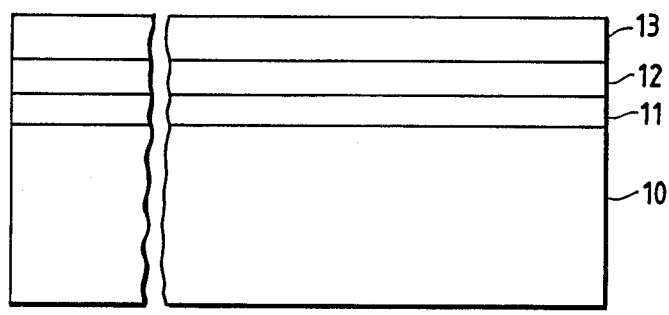
FIG. 3 is an illustration of a multi-component thin film fabricated according to the present invention.

The sputtering chamber was evacuated to a vacuum of $5 \times 10^{-4}$ Pa (or $10\mu$ Bar) and a mixture of Argon and oxygen in equal amounts was introduced to the evacuated chamber until a vacuum of 3 Pa was attained. Substrate 10 was heated to a temperature of 700° C. to initiate reactive deposition. The settings of voltage sources 5, 6, 7 and 8 were adjusted so that the input power levels for sputtering lead, lanthanum, zirconium and titanium were initially set at 15, 30, 0 and 180 watts, respectively. This resulted in epitaxial growth of a 300-Angstrom thick thin film 11 of $Pb_{0.72}La_{0.28}Ti_{0.93}O_3$ on the sapphire substrate 10 as shown in FIG. 3. This proved that this composition has a tendency to easily crystallize on the aforesaid sapphire surface. The voltage source settings were then controlled so that the input power levels of lead, lanthanum, zirconium and titanium were gradually changed to 20, 15, 60 and 90 watts respectively over the period of 20 minutes so that a transition layer 12 of PLZT of gradually varying compositions was epitaxially grown on the first layer 11 to a thickness of 200 Angstroms. The settings of the voltage sources were maintained at the last-mentioned values until a third thin film 13 of $Pb_{0.92}La_{0.08}(Zr_{0.65}Ti_{0.35})_{0.98}O_3$, or simply PLZT(8/65/35), of 3000-Angstrom thickness was deposited on the transition layer 12.

Detailed analyses showed that the inventive method could effectively be utilized in forming the intended multi-component thin-film structure if the content of Pb in the first layer 11 is greater than the content of the same component in the third layer 13. This was achieved by heating the substrate 10 at a first temperature during the process of forming the first layer 11 and raising the temperature when the third layer 13 is formed. It follows from this that the inventive method proved satisfactory if a component of the multi-component structure having a higher vapor pressure than any other components is included in a higher content in the first layer 11 than in the third layer 13. In fact, even if the multi-component structure contained elements having substantial differences in vapor pressure, a selection of a high vapor-pressure component as an element of the first layer 11 results in a desired end product. This is considered to arise from the fact that revaporization of the high vapor-pressure component from the surface of the deposited third layer 13 is suppressed somewhat due to the influence of the higher content of the same component in the first layer 11.

Preferably, the first layer 11 essentially consists of a multi-component material of a first formula, $[Pb_{1-(x/100)}La_{x/100}][Zr_{y/100}Ti_{z/100}]_wO_3$, in which $10 \leq x \leq 40$, $y \leq 5$, where $w = 1 - (x/400)$ and $y + z = 100$. The third layer 13 essentially consists of a multi-component material of a third formula $[Pb_{1-(X/100)}La_{X/100}][Zr_{Y/100}Ti_{Z/100}]_WO_3$, in which $X \leq 20$, $40 \leq Y \leq 90$, where $W = 1 - (X/400)$ and $Y + Z = 100$. The transition second layer 12 formed between the first and third layers has a composition which varies in a range from the first formula at the boundary between said first and second layers to the third formula at the boundary between said second and third layers. In particular, if the X-value of the third layer 13 is in the range between 7 and 10 and the Y-value is in the range between 60 and 70 and if the Z-value is in the range between 30 and 40, the multi-component thin film device of the invention exhibits an electrooptic chararacteristic. Furthermore, if the X-value is smaller than 20 and the Y-value is in the range between 40 and 90, the device exhibits a piezoelectric property.

From the standpoint of manufacture it is preferred that the Y-value be smaller than 30 and the X-value be in the range between 10 and 40.

Figure 4A:
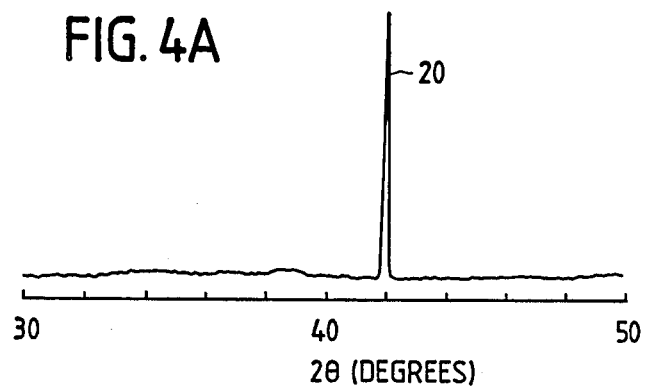
FIGS. 4A and 4B are graphic illustrations of the comparative results obtained by X-ray diffraction techniques.
Figure 4B:
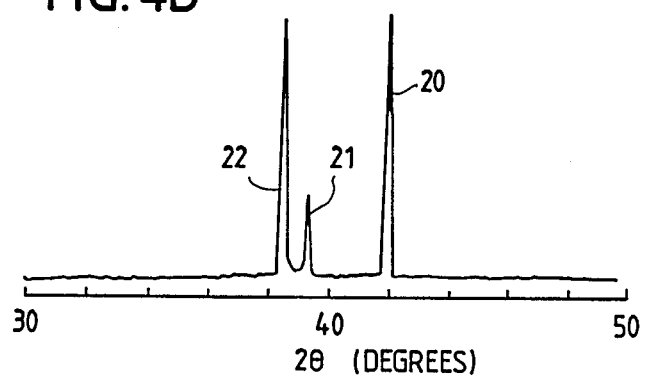

FIG. 4B shows the result of an X-ray (CuKα rays) diffraction pattern of the multi-component structure. A peak 20 is a "0006" diffraction by the substrate 10 at $2\theta = 41.7°$, a peak 21 is a "111" diffraction by the $Pb_{0.72}La_{0.28}Ti_{0.93}O_3$ layer 11 and a peak 22 is a "111" diffraction by the PLZT(8/65/35) layer 13. FIG. 4A shows an X-ray diffraction pattern obtained by a PLZT thin film facricated by any other methods than that described above. The diffraction pattern includes only one peak 20 which is a "0006" diffraction by substrate 10.

Figure 5:
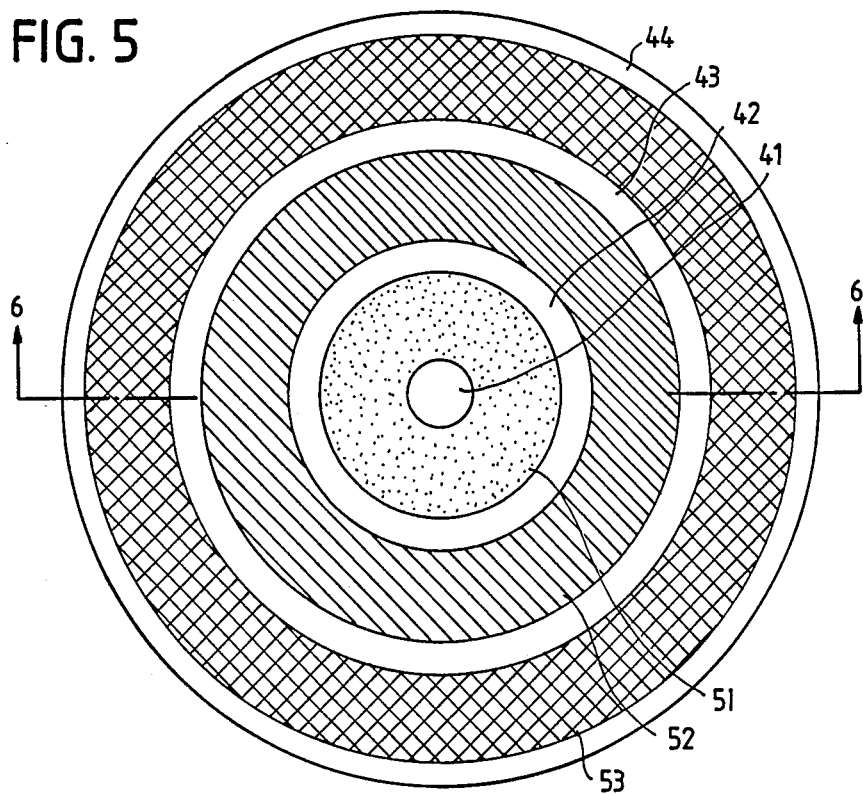
FIG. 5 is a plan view of a sputtering apparatus according to another embodiment of the invention.
Figure 6:
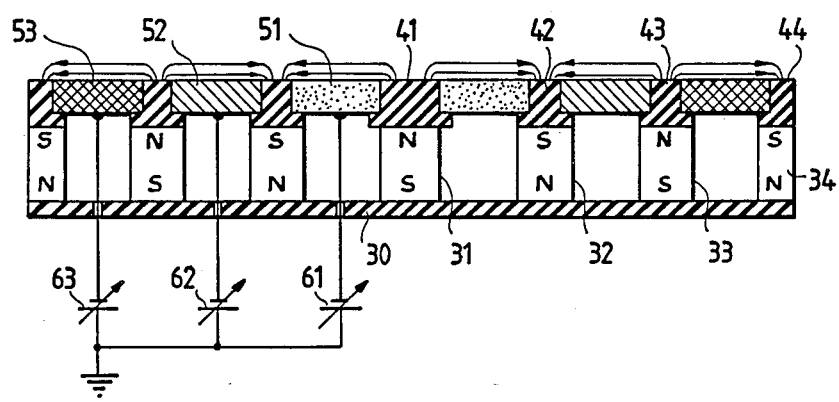
FIG. 6 is a cross-sectional view taken along the lines 6—6 of FIG. 5.

FIGS. 5 and 6 are illustrations of a sputtering apparatus according to a further embodiment of the invention. This sputtering apparatus comprises a base 30 and a plurality of permanent magnets mounted thereon. A cylindrical magnet 31 is located at the center of base 30 with a North pole facing upward. An inner ring magnet 32 with a South pole facing upward surrounds the center magnet 31. Concentrically with the magnets 31 and 32, an intermediate ring magnet 33 with a North pole facing upward and an outer ring magnet 34 with a South pole facing upward are provided. Magnets 31, 32, 33 and 34 are provided with insulators 41, 42, 43 and 44, respectively, of which the insulators 41 is of a circular shape and the insulators 42, 43 and 44 are in the shape of a ring to support a plurality of ring-shaped sputtering members 51, 52 and 53 such as lead, lanthanum and titanium, for example. Variable DC voltages are supplied to sputtering members 51, 52 and 53 from DC voltage sources 61, 62 and 63, respectively. Parallel magnetic fields are generated by the magnets 31–34 over the surfaces of the sputtering members to effect the concentration of plasma. The ring-shaped construction eliminates localized concentration of compositions and produces a thin film having a uniform distribution of composition of the same formula over the surface of deposition.

The method as taught by the present invention could equally be as well applied to the process of forming a dielectric thin film such as $Bi_{12}SiO_{20}$ and to the process of forming a metallic thin film having magnetooptic properties such as PtMnSb.

The foregoing description shows only preferred embodiments of the present invention. Various modifications are apparent to those skilled in the art without departing from the scope of the present invention which is only limited by the appended claims. Therefore, the embodiments shown and described are only illustrative, not restrictive.

What is claimed is:

1. A method for sputtering a multi-component thin film, comprising:
   sputtering a first layer of a first multi-component material of a first formula on a substrate;
   sputtering a second, transition layer of a second multi-component material of a second, variable formula on said first layer; and
   sputtering a third layer of a third multi-component material of a third formula on said transition layer, said second formula being variable in a range from said first formula at the boundary between said first and second layers to said third formula at the boundary between said second and third layers, each of said multi-component materials comprising lead, lanthanum, zirconium, titanium and oxygen.

2. A method as claimed in claim 1 wherein said first formula is $[Pb_{1-(x/100)}La_{x/100}][Zr_{y/100}Ti_{z/100}]_wO_3$, in which $10 \leq x \leq 40$, $y \leq 5$, $w = 1 - (x/400)$ and $y + z = 100$, and said third formula is $[Pb_{1-(X/100)}La_{X/100}][Zr_{Y/100}Ti_{Z/100}]_WO_3$, in which $X \leq 20$, $40 \leq Y \leq 90$, $W = 1 - (X/400)$ and $Y + Z = 100$.

3. A method as claimed in claim 1, wherein the formation of the first, second and third layers is continuously performed from the first layer to the third layer.

4. A method for sputtering a multi-component thin film on a substrate, comprising the steps of:
   (a) providing a plurality of sputtering sources for sputtering materials to be deposited on said substrate;
   (b) controlling the amounts of said materials sputtered respectively by said sources and sputtering a first layer of a first multi-component material of first formula on said substrate;
   (c) controlling said amounts for sputtering a second, transition layer of a second multi-component material of a second, variable formula on said first layer; and
   (d) controlling said amounts for sputtering a third layer of a third multi-component material of a third formula on said transition layer, said second formula being variable in a range from said first formula at the boundary between said first and second layers to said second formula at the boundary between said second and third layers, each of said multi-component materials comprising lead, lanthanum, zirconium, titanium and oxygen.

5. A method as claimed in claim 4, wherein said first formula is $[Pb_{1-(x/100)}La_{x/100}][Zr_{y/100}Ti_{z/100}]_wO_3$, in which $10 \leq x \leq 40$, $y \leq 5$, $w = 1-(x/400)$ and $y+z = 100$, and said third formula is $[Pb_1-(X/100)La_{X/100}][Zr_{Y/100}Ti_{Z/100}]_WO_3$, in which $X \leq 20$, $40 \leq Y \leq 90$, $W = 1-(X/400)$ and $Y+Z = 100$.

6. A method as claimed in claim 4, wherein the step (b) comprises heating said substrate at a first temperature and the step (d) comprises heating said substrate at a second temperature which is higher than said first temperature.

7. A method as claimed in claim 4, wherein said sputtering sources are connected to be biased at a first potential and said substrate is located on an electrode connected to be biased at a second, opposite potential, and further comprising providing magnetic fields parallel to the surfaces of said sputtering sources through which materials to be deposited are sputtered.

8. A method as claimed in claim 7, comprising providing a plurality of sputtering sources in the shape of concentric rings for sputtering the materials to be deposited on the substrate.

9. A method as claimed in claim 4, wherein the formation of the first, second and third layers is continuously performed from the first layer to the third layer.

* * * * *